United States Patent
Liao

(10) Patent No.: US 9,018,772 B2
(45) Date of Patent: Apr. 28, 2015

(54) CHIP STRUCTURE AND MULTI-CHIP STACK PACKAGE

(71) Applicant: ChipMOS Technologies Inc., Hsinchu (TW)

(72) Inventor: Tsung-Jen Liao, Hsinchu (TW)

(73) Assignee: ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 13/845,129

(22) Filed: Mar. 18, 2013

(65) Prior Publication Data
US 2014/0159253 A1    Jun. 12, 2014

(30) Foreign Application Priority Data
Dec. 10, 2012  (TW) .............................. 101146413 A

(51) Int. Cl.
| H01L 25/04 | (2014.01) |
| H01L 25/065 | (2006.01) |
| H01L 25/075 | (2006.01) |
| H01L 23/538 | (2006.01) |
| H01L 23/00 | (2006.01) |
| H01L 23/48 | (2006.01) |

(52) U.S. Cl.
CPC ........ *H01L 23/5386* (2013.01); *H01L 25/0652* (2013.01); *H01L 25/0756* (2013.01); *H01L 25/043* (2013.01); *H01L 2224/49174* (2013.01); *H01L 24/11* (2013.01); *H01L 2224/16145* (2013.01); *H01L 23/481* (2013.01); *H01L 25/0657* (2013.01)

(58) Field of Classification Search
CPC .............. H01L 25/043; H01L 25/0652; H01L 25/0657; H01L 25/0756; H01L 2224/49174
USPC .................................................... 257/686, 777
See application file for complete search history.

(56) References Cited

U.S. PATENT DOCUMENTS

| 2007/0035015 A1* | 2/2007 | Hsu ............................... 257/723 |
| 2009/0206464 A1* | 8/2009 | Chung et al. .................. 257/686 |
| 2010/0019359 A1* | 1/2010 | Pagaila et al. ................. 257/659 |
| 2013/0075936 A1* | 3/2013 | Lin et al. ........................ 257/777 |

* cited by examiner

*Primary Examiner* — Phat X Cao
(74) *Attorney, Agent, or Firm* — Jianq Chyun IP Office

(57) ABSTRACT

A chip structure and a multi-chip stack package are provided. The chip structure includes a chip, at least one interlink plate and a plurality of first connection terminals. The chip has an active surface, a back surface opposite to the active surface and a plurality of side surfaces respectively connected to the active surface and the back surface. The chip includes at least one bond pad disposed on the active surface and at least one joint pad disposed on the back surface. The interlink plate substantially parallel to one of the side surfaces includes a base and a conductive pattern disposed on the base. The conductive pattern is located between the base and the chip. The first connection terminals are disposed between the chip and the interlink plate. The bond pad is electrically connected to the joint pad through the first connection terminals and the conductive pattern.

15 Claims, 4 Drawing Sheets

CHIP STRUCTURE AND MULTI-CHIP STACK PACKAGE

CROSS-REFERENCE TO RELATED APPLICATION

This application claims the priority benefit of Taiwan application serial no. 101146413, filed on Dec. 10, 2012. The entirety of the above-mentioned patent application is hereby incorporated by reference herein and made a part of this specification.

BACKGROUND

1. Technical Field

The invention relates to a chip structure and a multi-chip stack package. Particularly, the invention relates to a chip structure with vertical electrical conduction and a multi-chip stack package.

2. Related Art

In today's information society, users pursue high-speed, high-quality and multi-functional electronic products. In view of an appearance of the electronic product, the design of the electronic product tends toward lightness, thinness, shortness and smallness. In order to achieve the aforementioned object, many companies introduce a systematic concept into circuit design, such that a single chip may have multiple functions to decrease the number of the chips configured in the electronic products. Moreover, regarding an electronic packaging technique, to cope with the design trend of lightness, slimness, shortness and smallness, a multi-chip module (MCM) package, a chip scale package (CSP) and a stacked multi-chip package, etc. are developed. Moreover, a three-dimensional integrated circuit (3D IC) integration technique becomes a trend of today's electronic packaging technique.

In detail, the 3D IC integration technique is one of the most effective structures capable of improving performance of the electronic products, which allows a vertical stacking connection of multiple chips to integrate more computing power, memories and other functions into an extremely tiny device. However, the conventional 3D IC integration of through silicon via (TSV) requires manufacturing processes of laser perforation, physical vapor deposition (PVD), and plasma-enhanced chemical vapor deposition (PECVD), etc. Therefore, the manufacturing cost of the TSV is very high due to expansive vacuum and dry processing equipment and consumptive materials thereof. Therefore, it is urgent and necessary to reduce the high cost of the 3D IC integration.

SUMMARY

Accordingly, the invention is directed to a chip structure with vertical electrical conduction, which has a simple manufacturing process and a low manufacturing cost.

The invention is directed to a multi-chip stack package, which has a simple manufacturing process and a low manufacturing cost as it is unnecessary to purchase additional equipment.

The invention provides a chip structure including a chip, at least one interlink plate and a plurality of first connection terminals. The chip has an active surface, a back surface opposite to the active surface and a plurality of side surfaces respectively connected to the active surface and the back surface. The chip includes at least one bond pad disposed on the active surface and at least one joint pad disposed on the back surface. The interlink plate substantially parallel to one of the side surfaces includes a base and a conductive pattern disposed on the base. The conductive pattern is located between the base and the chip. The first connection terminals are disposed between the chip and the interlink plate. The bond pad is electrically connected to the joint pad through the first connection terminals and the conductive pattern.

The invention provides a multi-chip stack package including a plurality of chip structures, wherein each of the chip structures includes a chip, at least one interlink plate and a plurality of first connection terminals. The chip has an active surface, a back surface opposite to the active surface and a plurality of side surfaces respectively connected to the active surface and the back surface. The chip includes at least one bond pad disposed on the active surface, at least one joint pad disposed on the back surface and at least one second connection terminal. The bond pad is disposed adjacent to the edge of the active surface, and the joint pad is disposed adjacent to the edge of the back surface. At least one trace is configured on the active surface. The trace is connected to the bond pad and extends towards a center of the active surface. The second connection terminal is disposed on the trace. The interlink plate substantially parallel to one of the side surfaces includes a base and a conductive pattern disposed on the base. The conductive pattern is located between the base and the chip. The first connection terminals are disposed between the chip and the interlink plate. The bond pad is electrically connected to the joint pad through the first connection terminals and the conductive pattern. The chip structures are stacked to each other, and each of the chip structures is electrically connected to the adjacent chip structures through the second connection terminals thereof.

The invention provides a multi-chip stack package including a chipset, at least one interlink plate and a plurality of first connection terminals. The chipset has a plurality of chips being stacked to each other. Each of the chips has an active surface, a back surface opposite to the active surface and a plurality of side surfaces respectively connected to the active surface and the back surface. Each of the chips includes at least one bond pad disposed on the active surface. The interlink plate substantially parallel to one of the side surfaces of the chips includes a base and a conductive pattern disposed on the base. The conductive pattern is located between the base and the chipset. The first connection terminals are disposed between the chipset and the interlink plate. The bond pads of the chips are electrically connected to each other through the first connection terminals and the conductive pattern.

According to the above descriptions, the interlink plate having the conductive pattern is disposed substantially parallel to the side surface of the chip, and the connection terminals are disposed between the chip and the interlink plate to respectively connect the bond pad on the active surface of the chip and the joint pad on the back surface of the chip to the conductive pattern of the interlink plate. In this way, the bond pad on the active surface of the chip and the joint pad on the back surface of the chip are electrically connected through an electrical connection path formed by the connection terminals and the conductive pattern of the interlink plate, such that the chip forms a vertical electrical connection from top to bottom to facilitate the execution of chip stacking.

Moreover, the invention can be applied to a multi-chip stack package, in which the interlink plate is disposed substantially parallel to the side surface of the chipset of the multi-chip stack package, and the connection terminals are disposed between the chipset and the interlink plate to respectively connect the bond pad on the active surface of each chip to the conductive pattern of the interlink plate. The vertically stacked chips of the chipset can be electrically connected to each other through the connection terminals and the conductive pattern. Compared to the conventional chip packaging technique, the complicated manufacturing processes are simplified and expansive manufacturing equipment is omitted. Therefore, the invention can effectively simplify the manufacturing process and decrease the production cost.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
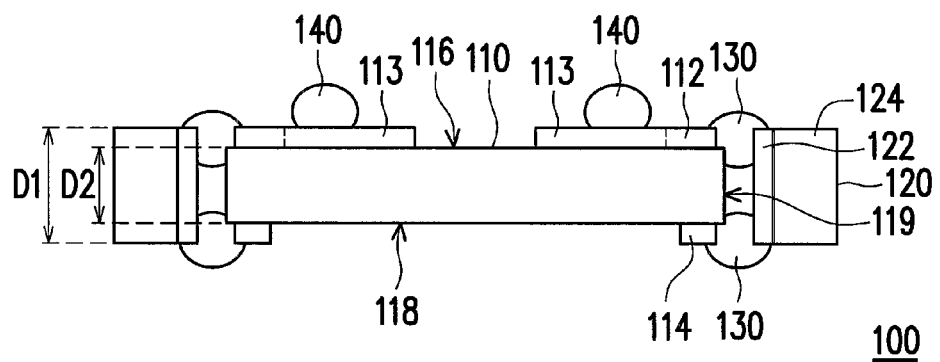
FIG. 1 is a cross-sectional view of a chip structure according to an embodiment of the invention.
Figure 2:
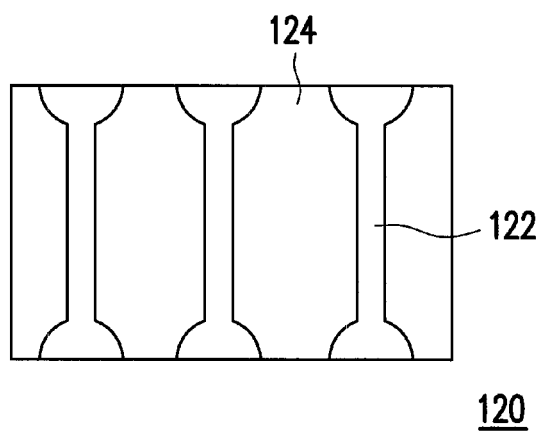
FIG. 2 is a top view of an interlink plate of FIG. 1.

FIG. 1 is a cross-sectional view of a chip structure according to an embodiment of the invention. FIG. 2 is a top view of an interlink plate of FIG. 1. Referring to FIG. 1 and FIG. 2, in the present embodiment, the chip structure 100 includes a chip 110, at least one interlink plate 120 (two interlink plates illustrated herein) and a plurality of first connection terminals 130. The chip 110 has an active surface 116, a back surface 118 opposite to the active surface 116 and a plurality of side surfaces 119 respectively connected to the active surface 116 and the back surface 118. The chip 110 includes at least one bond pad 112 (two bond pads illustrated herein) and at least one joint pad 114 (two joint pads illustrated herein). The bond pads 112 are disposed on the active surface 116 of the chip 110, and the joint pads 114 are disposed on the back surface 118 opposite to the active surface 116.

Accordingly, each of the interlink plates 120 is disposed substantially parallel to one of the side surfaces 119. In the present embodiment, a length D1 of the interlink plate 120 is substantially greater than or equal to a thickness D2 of the chip 110. It should be noticed that, in FIG. 1, the two interlink plates 120 are respectively disposed on the two opposite side surfaces 119 of the chip 110; however, the number of the interlink plates 120 and positions of the side surfaces 119 the interlink plates 120 disposed on are not limited in the invention. As shown in FIG. 2, the interlink plates 120 includes a base 124 and a conductive pattern 122. The conductive pattern 122 is disposed on the base 124 and is located between the base 124 and the chip 110. The first connection terminals 130 are disposed between the chip 110 and the interlink plate 120. The bond pads 112 are disposed adjacent to the edge of the active surface 116, the joint pads 114 are disposed adjacent to the edge of the back surface 118, and the first connection terminals 130 respectively connect the bond pad 112 and the joint pad 114 to the conductive pattern 122. In this way, the bond pad 112 can be electrically connected to the joint pad 114 through the first connection terminals 130 and the conductive pattern 122. Namely, the bond pad 112 and the joint pad 114 are electrically connected through an electrical connection path formed by the first connection terminals 130 and the conductive pattern 122. In the present embodiment, the bond pads 112 and the joint pads 114 are respectively the redistribution layers (RDL) on the active surface 116 and the back surface 118 of the chip 110. On the active surface 116, the RDL further includes at least one trace 113 (two traces illustrated herein), and the traces 113 are connected to the corresponding bond pads 112 and extend toward a center of the active surface 116. In the present embodiment, the chip 110 further includes at least one second connection terminal 140 (two second connection terminals illustrated herein). The second connection terminals 140 are respectively disposed on the traces 113 so that the chip 110 can be electrically connected to external circuits through the second connection terminals 140. In the present embodiment, the first connection terminals 130 and the second connection terminals 140 are, for example, solder balls.

Figure 3A:
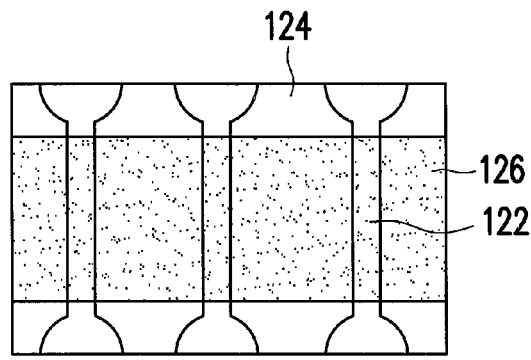
FIG. 3A is a top view of an interlink plate according to another embodiment of the invention.
Figure 3B:
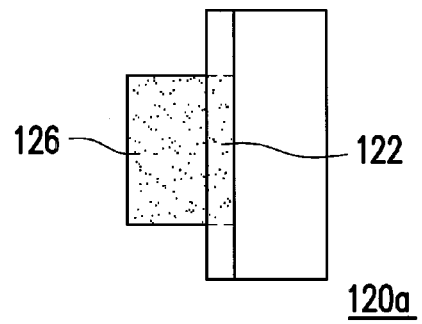
FIG. 3B is a cross-sectional view of the interlink plate of FIG. 3A.

FIG. 3A is a top view of an interlink plate according to another embodiment of the invention. FIG. 3B is a cross-sectional view of the interlink plate of FIG. 3A. Referring to FIG. 3A and FIG. 3B, the interlink plate 120a of the present embodiment further includes a dielectric layer 126 disposed on the base 124 to partially cover the conductive pattern 122. Here, the region partially covered by the dielectric layer 126 refers to a part of the conductive pattern 122 outside the part used for connecting the first connection terminals 130. The dielectric layer 126 can not only provide the interlink plate 120a buffer effect and adhesion, but can also prevent penetration or attachment of the undesired ions (for example, sodium ions), moisture, transition metals (for example, gold, copper or silver, etc.) or other contamination which may cause oxidation or improper bridging of the underlying conductive pattern 122.

Figure 4:
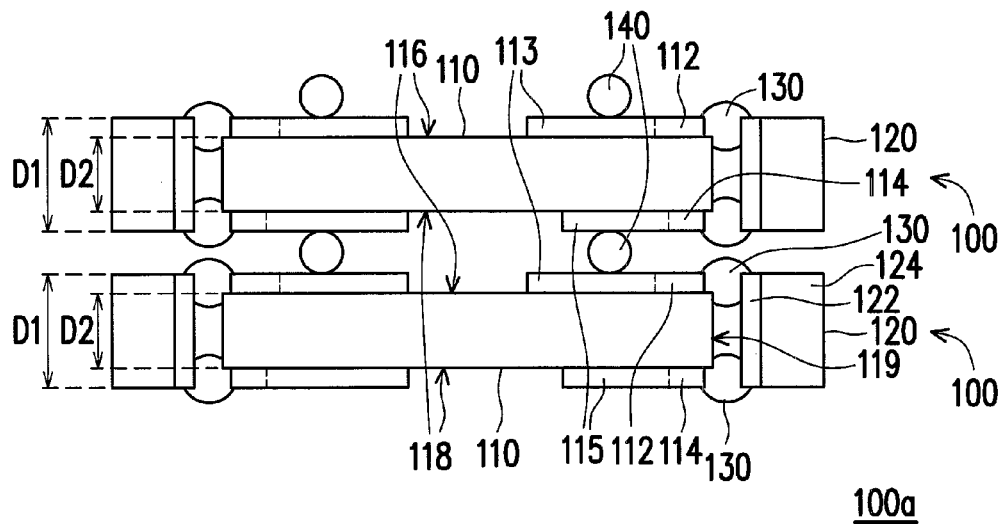
FIG. 4 is a cross-sectional view of a multi-chip stack package according to an embodiment of the invention.

FIG. 4 is a cross-sectional view of a multi-chip stack package according to an embodiment of the invention. Referring to FIG. 4, the multi-chip stack package 100a of the present embodiment is formed by stacking a plurality of the chip structures 100 of FIG. 1. It should be noticed that reference numbers of the components and a part of contents of the embodiment of FIG. 1 are also used in the present embodiment, where the same reference numbers denote the same or alike components, and descriptions of the same technical contents are omitted herein. The aforementioned embodiment can be referred to for descriptions of the omitted parts, and detailed descriptions thereof are not repeated in the present embodiment. As shown in FIG. 4, the multi-chip stack package 100a includes a plurality of chip structures 100 (two chip structures illustrated herein), where each of the chip structures 100 includes a chip 110, at least one interlink plate 120 and a plurality of first connection terminals 130. In the present embodiment, each of the chips 110 is the same as the chip 110 of FIG. 1, and the bond pad 112 on the active surface 116 of each chip 110 is electrically connected to the joint pad 114 on the back surface 118 through the corresponding interlink plate 120. Traces 113 and 115 are respectively configured on the active surface 116 and the back surface 118 of each chip 110 as shown in FIG. 4, and are connected to the bond pad 112 and the joint pad 114 and extend toward the centers of the active surface 116 and the back surface 118 respectively, and each chip 110 has a second connection terminal 140 disposed on the trace 113. The chip structures 100 are stacked to each other, and each chip structure 100 is connected to an adjacent chip structure 100 through the second connection terminal 140 thereof. Specifically, the second connection terminal 140 of the chip structure 100 is correspondingly connected to the trace 115 of the adjacent chip structure 100 to form an electrical conducting path of the multi-chip stack package 100a.

Figure 5:
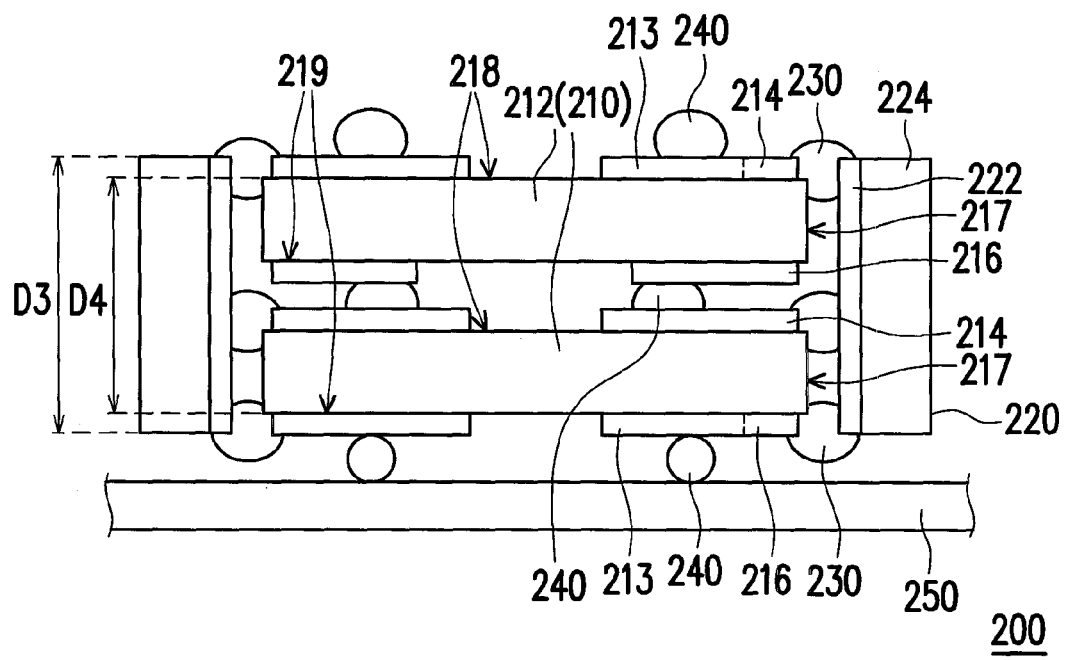
FIG. 5 is a cross-sectional view of a multi-chip stack package according to another embodiment of the invention.

FIG. 5 is a cross-sectional view of a multi-chip stack package according to another embodiment of the invention. Referring to FIG. 5, in the present embodiment, the multi-chip stack package 200 includes a chipset 210, at least one interlink plate 220 and a plurality of first connection terminals 230. The chipset 210 includes a plurality of chips 212 (two chips illustrated herein). The chips 212 are stacked to each other, and each of the chips 212 has an active surface 218, a back surface 219 opposite to the active surface 218 and a plurality of side surfaces 217 respectively connected to the active surface 218 and the back surface 219. Each of the chips 212 includes at least one bond pad 214 disposed on the active surface 218. In the present embodiment, each of the chips 212 further includes at least one joint pad 216 disposed on the back surface 219 of the chip 212, where the bond pad 214 is disposed adjacent to the edge of the active surface 218, and the joint pad 216 is disposed adjacent to the edge of the back surface 219. The bond pad 214 and the joint pad 216 are respectively the redistribution layers (RDL) on the active surface 218 and the back surface 219 of the chip 210. On the active surface 218, the RDL further includes a trace 213, and the trace 213 is connected to the bond pad 214 and extends toward a center of the active surface 218. In the present embodiment, each of the chips 212 further includes at least one second connection terminal 240 disposed on the trace 213, and each chip 212 can be connected to the adjacent chip 212 or to an external component through the second connection terminals 240. In other words, the bond pad 214 of each chip 212 and the joint pad 216 of the adjacent chip 212 can be electrically connected through the second connection terminal 240. Moreover, the interlink plate 220 is substantially parallel to one of the side surfaces 217 of the chips 212. A length D3 of the interlink plate 220 is substantially greater than or equal to an overall height D4 of the chipset 210. In detail, the length D3 of the interlink plate 220 can be greater than or equal to a summation of the thicknesses of the chips 212 plus the height of the second connection terminals 240 connected between the chips 212. As shown in FIG. 5, the height D4 represents the summation of the thickness of the chips 212 plus the height of the second connection terminals 240 connected between the chips 212. In the present embodiment, the two interlink plates 220 are substantially parallel to two opposite side surfaces 217 of the chips 212 of the chipset 210; however, the number of the interlink plates 220 and positions of the side surfaces 217 the interlink plates 120 substantially parallel to are not limited in the invention.

Figure 6:
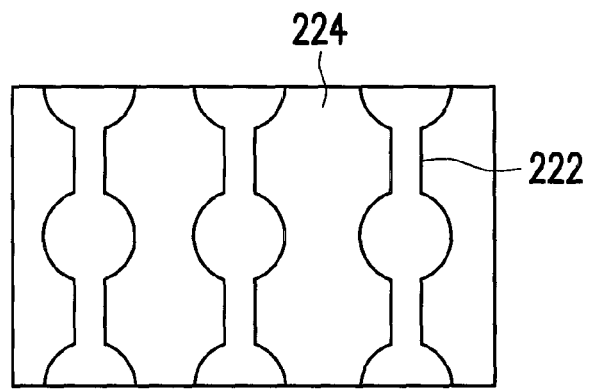
FIG. 6 is a top view of an interlink plate of FIG. 5.

FIG. 6 is a top view of an interlink plate of FIG. 5. Referring to FIG. 5 and FIG. 6, the interlink plate 220 includes a base 224 and a conductive pattern 222. The conductive pattern 222 is disposed on the base 224 and located between the base 224 and the chipset 210. The first connection terminals 230 are disposed between the chips 212 and the interlink plate 220, and respectively connect the bond pad 214 and the joint pad 216 to the conductive pattern 222. In this way, the bond pad 214 can be electrically connected to the joint pad 216 through the first connection terminals 230 and the conductive pattern 222. In the present embodiment, the chipset 210 has two chips 212 stacked to each other, and each of the chips 212 is connected to the adjacent chip 212 through a plurality of the second connection terminals 240, and the first connection terminals 230 are respectively connected to the bond pad 214 of each chip 212 and the joint pad 216 on the back surface 219 of the chip 212 located at the bottommost of the chipset 210. Namely, the vertically stacked chips 212 are electrically conducted through the conductive pattern 222 of the interlink plate 220 and the first connection terminals 230 that respectively connect the bond pad 214 and the joint pad 216 of each chip 212. In the present embodiment, the first connection terminals 230 and the second connection terminals 240 are, for example, solder balls. Moreover, the interlink plate 220 of the present embodiment may also have a dielectric layer as described in the aforementioned embodiment, where the dielectric layer is disposed on the base 224 to partially cover the conductive pattern 222, which not only provides the interlink plate 220 buffer effect and adhesion, but can also prevent penetration or attachment of undesired ions (for example, sodium ions), moisture, transition metals (for example, gold, copper or silver) or other contamination which may cause oxidation or improper bridging of the underlying conductive pattern 222. In the present embodiment, the multi-chip stack package 200 further includes a carrier 250, and the chipset 210 is disposed thereon. The second connection terminals 240 are also disposed on the back surface 219 of the chip 212 located at the bottommost of the chipset 210 and connected to the joint pads 216 so that the chipset 210 is electrically connected to the carrier 250 through the second connection terminals 240. In the present embodiment, the carrier is, for example, a substrate, a lead frame or a printed circuit board, etc.

Figure 7:
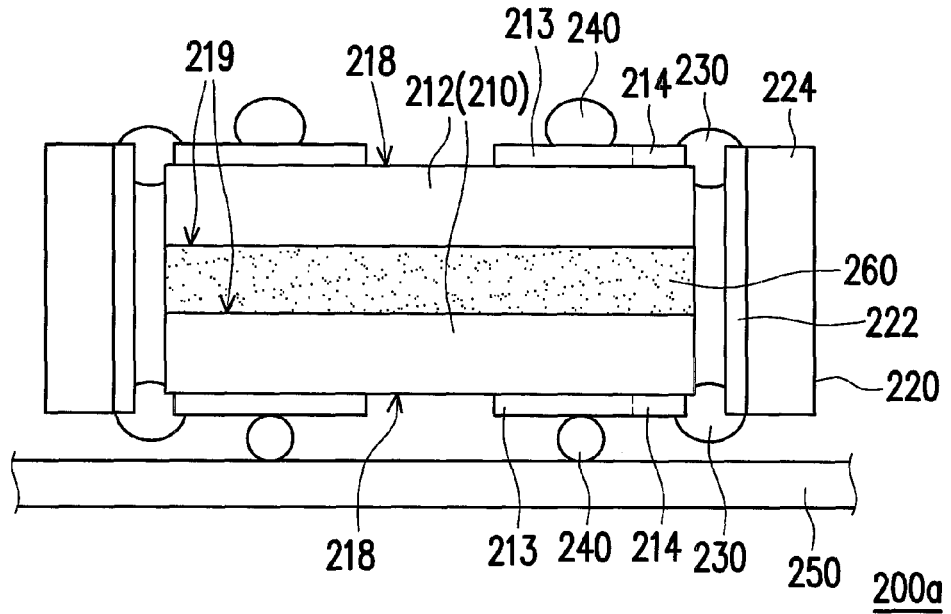
FIG. 7 is a cross-sectional view of a multi-chip, stack package according to another embodiment of the invention.

FIG. 7 is a cross-sectional view of a multi-chip stack package according to another embodiment of the invention. It should be noticed that reference numbers of the components and a part of contents of the embodiment of FIG. 5 are also used in the present embodiment, where the same reference numbers denote the same or alike components, and descriptions of the same technical contents are omitted. The aforementioned embodiment can be referred to for descriptions of the omitted parts, and detailed descriptions thereof are not repeated in the present embodiment. Referring to FIG. 7, the multi-chip stack package 200a of the present embodiment is similar to the multi-chip stack package 200 of FIG. 5, but the main differences between the two embodiments are that the chips 212 of the multi-chip stack package 200a of the present embodiment are arranged in a back-to-back manner instead, wherein the back surfaces 219 of the chips 212 of the chipset 210 are disposed facing each other, and a dielectric layer 260 is used to space and connect the chips 212. Namely, in the present embodiment, the dielectric layer 260 is disposed between any two adjacent back-to-back chips 212 to connect the chips 212. In the present embodiment, the chipset 210 includes two chips 212, and the bond pads 214 are respectively disposed on the active surfaces 218 of the chips 212.

In this way, the interlink plate 220 can respectively have the bond pads 214 on the active surfaces 218 of the two chips 212 being connected to the conductive pattern 222 thereof with two first connection terminals 230 so as to form the electrical connection between the two chips 212. In the present embodiment, the active surface 218 of each chip 212 may further include at least one trace 213, and the trace 213 is connected to the bond pad 214 and extends toward the center of the active surface 218. The chip 212 further includes a second connection terminal 240 disposed on the trace 213, and the chipset 210 can be electrically connected to the carrier 250 or other components through the second connection terminal 240.

Figure 8:
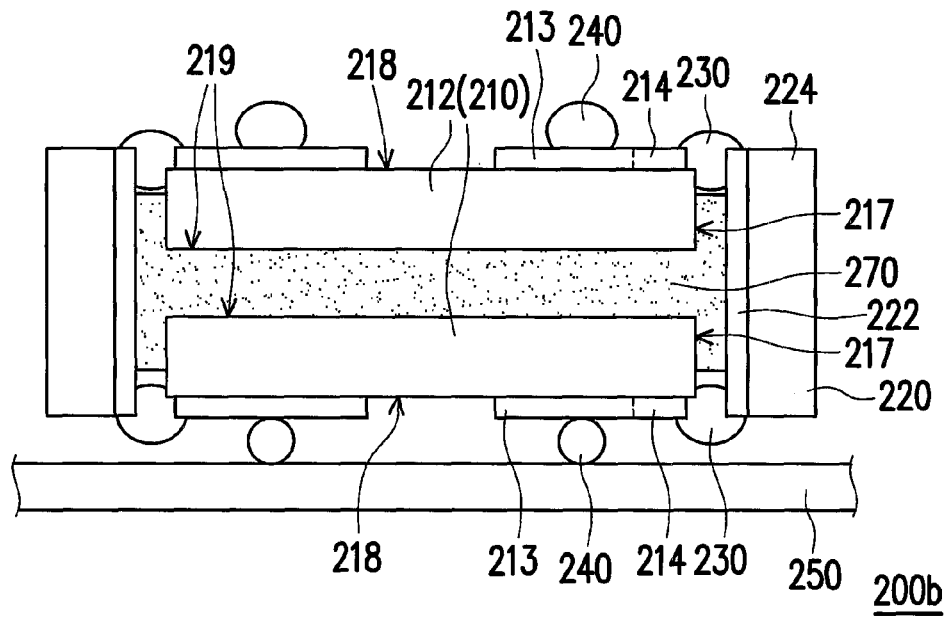
FIG. 8 is a cross-sectional view of a multi-chip stack package according to another embodiment of the invention.

FIG. 8 is a cross-sectional view of a multi-chip stack package according to another embodiment of the invention. It should be noticed that reference numbers of the components and a part of contents of the embodiment of FIG. 7 are also used in the present embodiment, where the same reference numbers denote the same or alike components, and descriptions of the same technical contents are omitted. The aforementioned embodiment can be referred to for descriptions of the omitted parts, and detailed descriptions thereof are not repeated in the present embodiment. Referring to FIG. 8, the multi-chip stack package 200b of the present embodiment is similar to the multi-chip stack package 200a of FIG. 7, but the main difference between the two embodiments is that a dielectric layer 270 of the present embodiment is disposed between any two adjacent chips 212 and between the interlink plate 220 and the chipset 210. In detail, the dielectric layer 270 of the present embodiment not only is disposed between any two adjacent chips 212, but can also be filled in the gap between the interlink plate 220 and the chipset 210 to partially cover the conductive pattern 222. Here, the region of the conductive pattern 222 partially covered refers to a part of the conductive pattern 222 outside the part used for connecting the first connection terminals 230. Therefore, the dielectric layer 270 not only can be used to connect any two adjacent chips 212 and the interlink plate 220, to provide buffer effect, but can also prevent penetration or attachment of undesired ions (for example, sodium ions), moisture, transition metals (for example, gold, copper or silver) or other contamination which may cause oxidation or improper bridging of the underlying conductive pattern 222.

In summary, the interlink plate having the conductive pattern is disposed substantially parallel to the side surface of the chip, and the connection terminals are disposed between the chip and the interlink plate to respectively connect the bond pad on the active surface of the chip and the joint pad on the back surface of the chip to the conductive pattern of the interlink plate. In this way, the bond pad on the active surface of the chip and the joint pad on the back surface of the chip are electrically connected through an electrical connection path formed by the connection terminals and the conductive pattern of the interlink plate, such that the chip forms a vertical electrical conduction from top to bottom.

Moreover, the invention can be applied to a multi-chip stack package, in which the interlink plate is disposed substantially parallel to the side surface of the chipset of the multi-chip stack package, and the connection terminals are disposed between the chipset and the interlink plate to have the vertically stacked chips of the chipset being electrically connected through the connection terminals and the conductive pattern on the interlink plate. Compared to the conventional chip packaging technique, the complicated manufacturing processes are simplified and expansive manufacturing equipment is omitted. Therefore, the invention can effectively simplify the manufacturing process and reduce the production cost.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A chip structure, comprising:
    a chip, having an active surface, a back surface opposite to the active surface and a plurality of side surfaces respectively connected to the active surface and the back surface, the chip comprising at least one bond pad disposed on the active surface and at least one joint pad disposed on the back surface;
    at least one interlink plate, substantially parallel to one of the side surfaces, and comprising a base and a conductive pattern formed on a plane surface of the base substantially parallel to the one of the side surfaces, wherein the conductive pattern is located between the plane surface of the base and the one of the side surfaces of the chip; and
    a plurality of first connection terminals, disposed on the plane surface of the base and connected to the conductive pattern and to at least a part of the one of the side surfaces of the chip, wherein the bond pad is electrically connected to the joint pad through the first connection terminals and the conductive pattern.

2. The chip structure as claimed in claim 1, wherein the bond pad is disposed adjacent to the edge of the active surface, and the joint pad is disposed adjacent to the edge of the back surface, at least one trace is configured on the active surface, and the trace is connected to the bond pad and extends toward a center of the active surface.

3. The chip structure as claimed in claim 2, wherein the chip further comprises at least one second connection terminal disposed on the trace.

4. The chip structure as claimed in claim 1, wherein the interlink plate further comprises a dielectric layer disposed on the base to partially cover the conductive pattern, and the dielectric layer is located between the base and the chip.

5. The chip structure as claimed in claim 1, wherein a length of the interlink plate is substantially greater than or equal to a thickness of the chip.

6. A multi-chip stack package, comprising a plurality of the chip structures as claimed in claim 3, wherein the chip structures are stacked to each other, and each of the chip structures is electrically connected to the adjacent chip structure through the at least one second connection terminal thereof.

7. The multi-chip stack package as claimed in claim 6, wherein each of the interlink plates further comprises a dielectric layer disposed on the base to partially cover the corresponding conductive pattern, and each of the dielectric layer is located between the corresponding base and the corresponding chip.

8. The multi-chip stack package as claimed in claim 6, wherein a length of each of the interlink plates is substantially greater than or equal to a thickness of the corresponding chip.

9. A multi-chip stack package, comprising:
    a chipset, comprising a plurality of chips stacked to each other, each of the chips having an active surface, a back surface opposite to the active surface and a plurality of side surfaces respectively connected to the active surface and the back surface, and each of the chips comprises at least one bond pad disposed on the active surface;
    at least one interlink plate, substantially parallel to one of the side surfaces of each of the chips, and comprising a base and a conductive pattern formed on a plane surface of the base substantially parallel to the one of the side surfaces, wherein the conductive pattern is located between the plane surface of the base and the one of the side surfaces of each of the chips of the chipset; and
    a plurality of first connection terminals, disposed on the plane surface of the base and connected to the conductive pattern and to at least a part of the one of the side surfaces of each of the chips of the chipset, wherein the bond pads of the chips are electrically connected to each other through the first connection terminals and the conductive pattern.

10. The multi-chip stack package as claimed in claim 9, wherein each of the chips further comprises at least one joint pad disposed on the back surface of the chip, and the bond pads are at least electrically connected to the joint pad of the chip located at the bottommost of the chipset through the first connection terminals and the conductive pattern.

11. The multi-chip stack package as claimed in claim 10, wherein each of the bond pads is disposed adjacent to the edge of the active surface of each chip, and each of the joint pad is disposed adjacent to the edge of each back surface, at least one trace is configured on the active surface of each chip, and the trace is connected to the bond pad and extends toward a center of the active surface.

12. The multi-chip stack package as claimed in claim 11, wherein each of the chips further comprises at least one second connection terminal, the at least one second connection terminal is disposed on the trace of one of the chips and connects the bond pad of the one of the chips to the joint pad of the chip adjacent to the one of the chips.

13. The multi-chip stack package as claimed in claim 9, wherein the interlink plate further comprises a dielectric layer disposed on the base to partially cover the conductive pattern, and the dielectric layer is located between the base and the chips.

14. The multi-chip stack package as claimed in claim 9, further comprising a dielectric layer disposed between any two adjacent chips to connect the chips.

15. The multi-chip stack package as claimed in claim 9, wherein a length of the interlink plate is substantially greater than or equal to an overall height of the chipset.

\* \* \* \* \*